United States Patent
Wang et al.

(10) Patent No.: US 9,106,453 B2
(45) Date of Patent: *Aug. 11, 2015

(54) REMOTE RADIO HEAD UNIT SYSTEM WITH WIDEBAND POWER AMPLIFIER AND METHOD

(71) Applicant: Dali Systems Co., Ltd., George Town, Grand Cayman (KY)

(72) Inventors: Chengxun Wang, Shenzhen (CN); Shawn Patrick Stapleton, Burnaby (CA)

(73) Assignee: DALI SYSTEMS CO. LTD., George Town Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/248,597

(22) Filed: Apr. 9, 2014

(65) Prior Publication Data
US 2014/0219174 A1    Aug. 7, 2014

Related U.S. Application Data

(63) Continuation of application No. 12/928,933, filed on Dec. 21, 2010, now Pat. No. 8,730,786.

(60) Provisional application No. 61/288,840, filed on Dec. 21, 2009.

(51) Int. Cl.
*H04J 1/12* (2006.01)
*H04L 27/00* (2006.01)
(Continued)

(52) U.S. Cl.
CPC ............ *H04L 27/0008* (2013.01); *H03F 1/304* (2013.01); *H03F 1/3247* (2013.01); *H03F 1/3258* (2013.01); *H03F 3/087* (2013.01); *H03F 3/19* (2013.01); *H03F 3/24* (2013.01); *H04L 25/067* (2013.01); *H04L 25/08* (2013.01); *H04W 24/02* (2013.01); *H03F 2200/18* (2013.01);
(Continued)

(58) Field of Classification Search
None
See application file for complete search history.

(56) References Cited

U.S. PATENT DOCUMENTS 4,638,248 A    1/1987    Schweickert
5,678,198 A    10/1997    Lemson
(Continued)

FOREIGN PATENT DOCUMENTS

CA    2 616 323 A1    12/2007
EP    1 746 720 A1    1/2007
(Continued)

OTHER PUBLICATIONS

Kim et al., "Adaptive Feedback Interference Cancellation System", 2003 IEEE MTT-S International Microwave Symposium Digest, 1:627-630, Jun. 13, 2003, 3 pages.
(Continued)

*Primary Examiner* — Kevin C Harper
(74) *Attorney, Agent, or Firm* — Kilpatrick Townsend & Stockton LLP

(57) ABSTRACT

A remote radio head unit (RRU) system for multiple operating frequency bands, multi-channels, driven by a single or more wide band power amplifiers. More specifically, the present invention enables multiple-bands RRU to use fewer power amplifiers in order to reduce size and cost of the multiband RRU. The present invention is based on the method of using duplexers and/or interference cancellation system technique to increase the isolation between the transmitter signal and receiver signal of the RRU.

17 Claims, 6 Drawing Sheets

(51) Int. Cl.

| | |
|---|---|
| *H03F 1/30* | (2006.01) |
| *H03F 1/32* | (2006.01) |
| *H03F 3/08* | (2006.01) |
| *H03F 3/19* | (2006.01) |
| *H03F 3/24* | (2006.01) |
| *H04W 24/02* | (2009.01) |
| *H04L 25/06* | (2006.01) |
| *H04L 25/08* | (2006.01) |

(52) U.S. Cl.
CPC ..... *H03F 2200/204* (2013.01); *H03F 2200/207* (2013.01); *H03F 2200/447* (2013.01); *H03F 2200/451* (2013.01); *H03F 2201/3206* (2013.01); *H03F 2201/3209* (2013.01); *H03F 2201/3212* (2013.01); *H03F 2201/3215* (2013.01); *H03F 2201/3224* (2013.01); *H03F 2201/3227* (2013.01)

(56) References Cited

U.S. PATENT DOCUMENTS

| | | | |
|---|---|---|---|
| 5,757,229 | A | 5/1998 | Mitzlaff |
| 6,246,286 | B1 | 6/2001 | Persson |
| 6,301,579 | B1 | 10/2001 | Becker |
| 6,424,225 | B1 | 7/2002 | Choi et al. |
| 6,625,429 | B1 | 9/2003 | Yamashita |
| 6,747,649 | B1 | 6/2004 | Sanz-Pastor et al. |
| 6,751,447 | B1 | 6/2004 | Jin et al. |
| 7,102,442 | B2 | 9/2006 | Anderson |
| 7,109,998 | B2 | 9/2006 | Smith |
| 7,362,125 | B2 | 4/2008 | Gupta et al. |
| 7,372,918 | B2 | 5/2008 | Muller et al. |
| 7,535,298 | B2 | 5/2009 | Sihlborn et al. |
| 7,542,518 | B2 | 6/2009 | Kim et al. |
| 7,583,754 | B2 | 9/2009 | Liu |
| 7,593,450 | B2 | 9/2009 | Conyers et al. |
| 7,606,324 | B2 | 10/2009 | Cai et al. |
| 7,831,221 | B2 | 11/2010 | Leffel et al. |
| RE42,287 | E | 4/2011 | Apodaca et al. |
| 8,014,745 | B1 | 9/2011 | Ho et al. |
| 8,730,786 | B2 | 5/2014 | Wang et al. |
| 2002/0072344 | A1 | 6/2002 | Souissi |
| 2003/0054760 | A1 | 3/2003 | Karabinis |
| 2003/0179829 | A1 | 9/2003 | Pincley et al. |
| 2005/0079834 | A1 | 4/2005 | Maniwa et al. |
| 2005/0226353 | A1 | 10/2005 | Gebara et al. |
| 2005/0262498 | A1 | 11/2005 | Ferguson et al. |
| 2006/0012426 | A1 | 1/2006 | Nezami |
| 2006/0045054 | A1 | 3/2006 | Utsumi et al. |
| 2006/0270366 | A1 | 11/2006 | Rozenblit et al. |
| 2007/0075780 | A1 | 4/2007 | Krvavac et al. |
| 2007/0171234 | A1 | 7/2007 | Crawfis et al. |
| 2009/0146736 | A1 | 6/2009 | Kim et al. |
| 2009/0163156 | A1 | 6/2009 | Rofougaran et al. |
| 2009/0232191 | A1 | 9/2009 | Gupta et al. |
| 2011/0007623 | A1 | 1/2011 | Cendrillon et al. |

FOREIGN PATENT DOCUMENTS

| | | |
|---|---|---|
| WO | WO 01/08297 A1 | 2/2001 |
| WO | WO 2008/154077 A1 | 12/2006 |
| WO | WO 2007/143843 A1 | 12/2007 |
| WO | WO 2011/077249 A2 | 6/2011 |

OTHER PUBLICATIONS

International Search Report for International Application No. PCT/IB2010/003452 mailed on Jun. 9, 2011, 2 pages.
First Office Action for corresponding Chinese Application No. 201080064329.4 dated Mar. 5, 2014, 8 pages.
Non-Final Office Action for U.S. Appl. No. 12/928,933 mailed on Aug. 9, 2013, 4 pages.
Final Office Action for U.S. Appl. No. 12/928,933 mailed on Jan. 31, 2014, 6 pages.
Notice of Allowance for U.S. Appl. No. 12/928,933 mailed on Mar. 18, 2014, 12 pages.

REMOTE RADIO HEAD UNIT SYSTEM WITH WIDEBAND POWER AMPLIFIER AND METHOD

RELATED APPLICATIONS

This application is a continuation of:

U.S. patent application Ser. No. 12/928,933, filed Dec. 21, 2010, entitled REMOTE RADIO HEAD UNIT SYSTEM WITH WIDEBAND POWER AMPLIFIER AND METHOD, which claims the benefit of U.S. Patent Application Ser. No. 61/288,840, filed Dec. 21, 2009, entitled REMOTE RADIO HEAD UNIT SYSTEM WITH WIDEBAND POWER AMPLIFIER AND METHOD and naming as inventors Chengxun Wang and Shawn Patrick Stapleton. Each of these applications is hereby incorporated by reference in its entirety for all purposes.

FIELD OF THE INVENTION

The present invention generally relates to wireless communication systems using power amplifiers and remote radio head units (RRU or RRH). More specifically, the present invention relates to RRU which are part of a distributed base station in which all radio-related functions are contained in a small single unit that can be deployed in a location remote from the main unit.

BACKGROUND OF THE INVENTION

Wireless and mobile network operators face the continuing challenge of building networks that effectively manage high data-traffic growth rates. Mobility and an increased level of multimedia content for end users require end-to-end network adaptations that support both new services and the increased demand for broadband and flat-rate Internet access. In addition, network operators must consider the most cost-effective solutions to expand network capacity and evolution towards 4G and beyond.

Wireless and mobile technology standards are evolving towards higher bandwidth requirements for both peak rates and cell throughput growth. The latest standards supporting this are HSPA+, WiMAX, TD-SCDMA and LTE. The network upgrades required to deploy networks based on these standards must balance the limited availability of new spectrum, leverage existing spectrum, and ensure operation of all desired standards. This all must take place at the same time during the transition phase, which usually spans many years.

Distributed open base station architecture concepts have evolved in parallel with the evolution of the standards to provide a flexible, cheaper, and more scalable modular environment for managing the radio access evolution. For example, the Open Base Station Architecture Initiative (OBSAI), the Common Public Radio Interface (CPRI), and the IR Interface standards introduced standardized interfaces separating the Base Station server and the remote radio head part of a base station by an optical fiber.

The RRU concept is a fundamental part of a state-of-the-art base station architecture. 2G/3G/4G base stations are typically connected to RRUs over optical fibers. Either CPRI, OBSAI or IR Interfaces may be used to carry data to the RRH to cover a three-sector cell. The RRU incorporates a large number of digital interfacing and processing functions. Traditionally, a multi-channel RRU means that multiple antennas are used, typically with two power amplifiers for two distinct bands. A duplexer is used to combine the two power amplifier outputs. Switches are used to isolate the transmit signals from the received signals as occurs in a Time Division Synchronous Code Division Multiple Access (TD-SCDMA) modulation. To extent the prior art architecture to multiple bands (i.e., two or more bands) implementation would consist of adding additional channelized power amplifiers in parallel. The output of the additional power amplifiers is typically combined in an N by 1 duplexer and fed to a single antenna.

While conventional RRU architecture offers some benefits, RRUs to date are power-inefficient, costly and inflexible. Further, their poor DC-to-RF power conversion ensures that they will have a large mechanical housing. In addition, current RRU designs are inflexible. As standards evolve, there is a need for multi-band RRUs that can accommodate two or more operating channels using a single wideband power amplifier. This creates an isolation problem at the individual receivers because the wideband power amplifier is always turned on. Isolation between the wideband transmitter and receivers is a problem with any modulation standard (HSPA+, WiMAX, LTE, etc.) when multi-band RRUs are developed using a single power amplifier. This is a common problem for all communication systems that utilize a wideband power amplifier in a multi-band scenario.

SUMMARY OF THE INVENTION

Accordingly, the present invention has been made in view of the above problems, and it is an object of the present invention to provide a high performance and cost effective technique for implementing RRU systems that service multi-frequency bands. Further, the present disclosure enables a RRU to be field-reconfigurable, and supports multi-modulation schemes (modulation agnostic), multi-carriers, multi-frequency bands, and multi-channels. The present invention also serves multi-frequency bands within a single RRU to economize the cost of radio network deployment. In particular, the present invention resolves an isolation issue for a RRU with fewer power amplifiers than the number of operating frequency bands. Multi-mode radios capable of operating according to GSM, HSPA, LTE, TD-SCDMA and WiMAX standards and advanced software configurability are key features in the deployment of more flexible and energy-efficient radio networks.

The present invention achieves the above objects using techniques generally based on methods and techniques for maximizing the isolation between the transmitted signal (Tx Signal) and the received signal (Rx Signal). The Tx Signal may comprise noise generated at the output of the power amplifier or it may comprise an unwanted transmitter band leaking into the receiver. With the use of the present invention, conventional RRU's can be extended to a multi-band and multi-channel configuration. Multi-band means that more than one frequency bands are used in the RRU and multi-channel means that more than one output antenna is used. Various embodiments of the invention are disclosed.

An embodiment of the present invention utilizes duplexers, switches and circulators to maximize the isolation between the transmitter and receiver. Another embodiment of the present invention utilizes an interference Cancellation System (ICS) together with duplexers, switches and circulators.

Applications of the present invention are suitable for use with all wireless base-stations, remote radio heads, distributed base stations, distributed antenna systems, access points, repeaters, mobile equipment and wireless terminals, portable wireless devices, and other wireless communication systems such as microwave and satellite communications. The present invention is also field upgradeable through a link such as an Ethernet connection to a remote computing center.

THE FIGURES

Further objects and advantages of the present invention can be more fully understood from the following detailed description taken in conjunction with the accompanying drawings in which.

GLOSSARY OF TERMS

ACLR Adjacent Channel Leakage Ratio
ACPR Adjacent Channel Power Ratio
ADC Analog to Digital Converter
AQDM Analog Quadrature Demodulator
AQM Analog Quadrature Modulator
AQDMC Analog Quadrature Demodulator Corrector
AQMC Analog Quadrature Modulator Corrector
BPF Bandpass Filter
CDMA Code Division Multiple Access
CFR Crest Factor Reduction
DAC Digital to Analog Converter
DET Detector
DHMPA Digital Hybrid Mode Power Amplifier
DDC Digital Down Converter
DNC Down Converter
DPA Doherty Power Amplifier
DQDM Digital Quadrature Demodulator
DQM Digital Quadrature Modulator
DSP Digital Signal Processing
DUC Digital Up Converter
EER Envelope Elimination and Restoration
EF Envelope Following
ET Envelope Tracking
EVM Error Vector Magnitude
FFLPA Feedforward Linear Power Amplifier
FIR Finite Impulse Response
FPGA Field-Programmable Gate Array
GSM Global System for Mobile communications
I-Q In-phase/Quadrature
IF Intermediate Frequency
LINC Linear Amplification using Nonlinear Components
LO Local Oscillator
LPF Low Pass Filter
MCPA Multi-Carrier Power Amplifier
MDS Multi-Directional Search
OFDM Orthogonal Frequency Division Multiplexing
PA Power Amplifier
PAPR Peak-to-Average Power Ratio
PD Digital Baseband Predistortion
PLL Phase Locked Loop
QAM Quadrature Amplitude Modulation
QPSK Quadrature Phase Shift Keying
RF Radio Frequency
RRU Remote Radio Head Unit
SAW Surface Acoustic Wave Filter
UMTS Universal Mobile Telecommunications System
UPC Up Converter
WCDMA Wideband Code Division Multiple Access
WLAN Wireless Local Area Network

DETAILED DESCRIPTION OF THE INVENTION

The present invention is a novel RRU system that utilizes a wideband power amplifier. The present invention is a hybrid system of digital and analog modules. The interplay of the digital and analog modules of the hybrid system eliminates interference between the wideband power amplifier output and the receiver's inputs. The present invention, therefore, achieves higher Transmitter (Tx) to Receiver (Rx) isolation when using wideband power amplifiers with multiple frequency bands.

Figure 1:
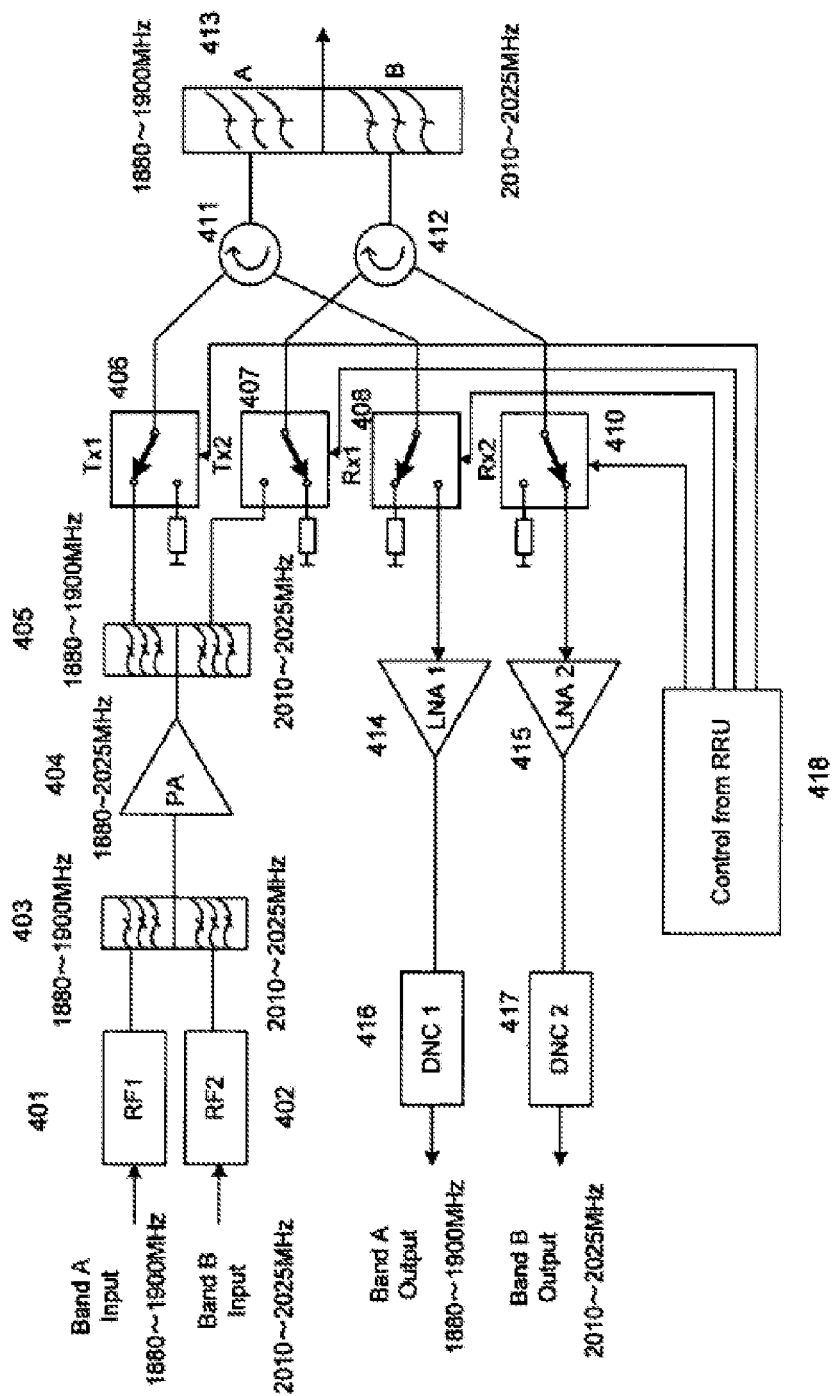
FIG. 1 is a block diagram of a TD-SCDMA dual-band single PA configuration in a remote radio head unit system in accordance with the present invention.

Referring first to FIG. 1, an embodiment of some aspects of the invention is shown in block diagram form. FIG. 1 depicts the analog section of a dual channel RRU. In this embodiment a single wideband power amplifier 404 is used. The two distinct frequency band signals 401, 402 are combined in a duplexer 403 and input to the wideband power amplifier 404. The output of the wideband power amplifier 404 is sent to a diplexer 405 in order to separate the two frequency band signals. This configuration enables the individual transmitter frequency bands to be independently turned-off. The Tx switches 406 and 407 are placed in the signal path after the diplexer 405. The signals are then passed through circulators 411 and 412 and a duplexer 413 in order to gain further isolation between the Tx signals and the Rx signals. The Rx switches 408 and 410 are placed on the third port of the circulator 411, 412. Alternatively, two or more frequency bands can be combined in one power amplifier using the same architecture as in FIG. 1.

Figure 2:
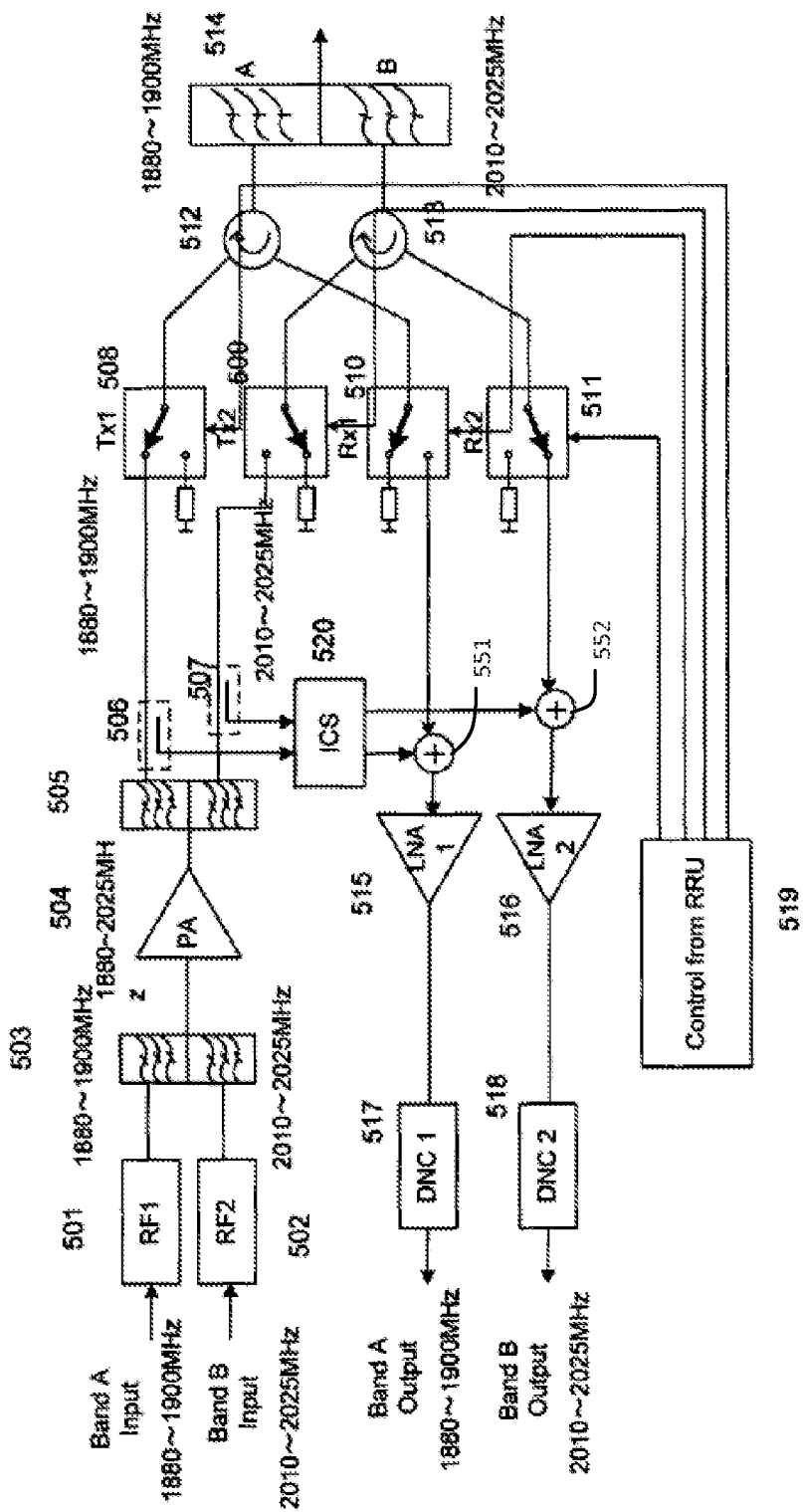
FIG. 2 is a block diagram of the TD-SCDMA dual-band single PA with an Interference Cancellation System (ICS) configuration in a remote radio head unit system in accordance with the present invention.
Figure 4:
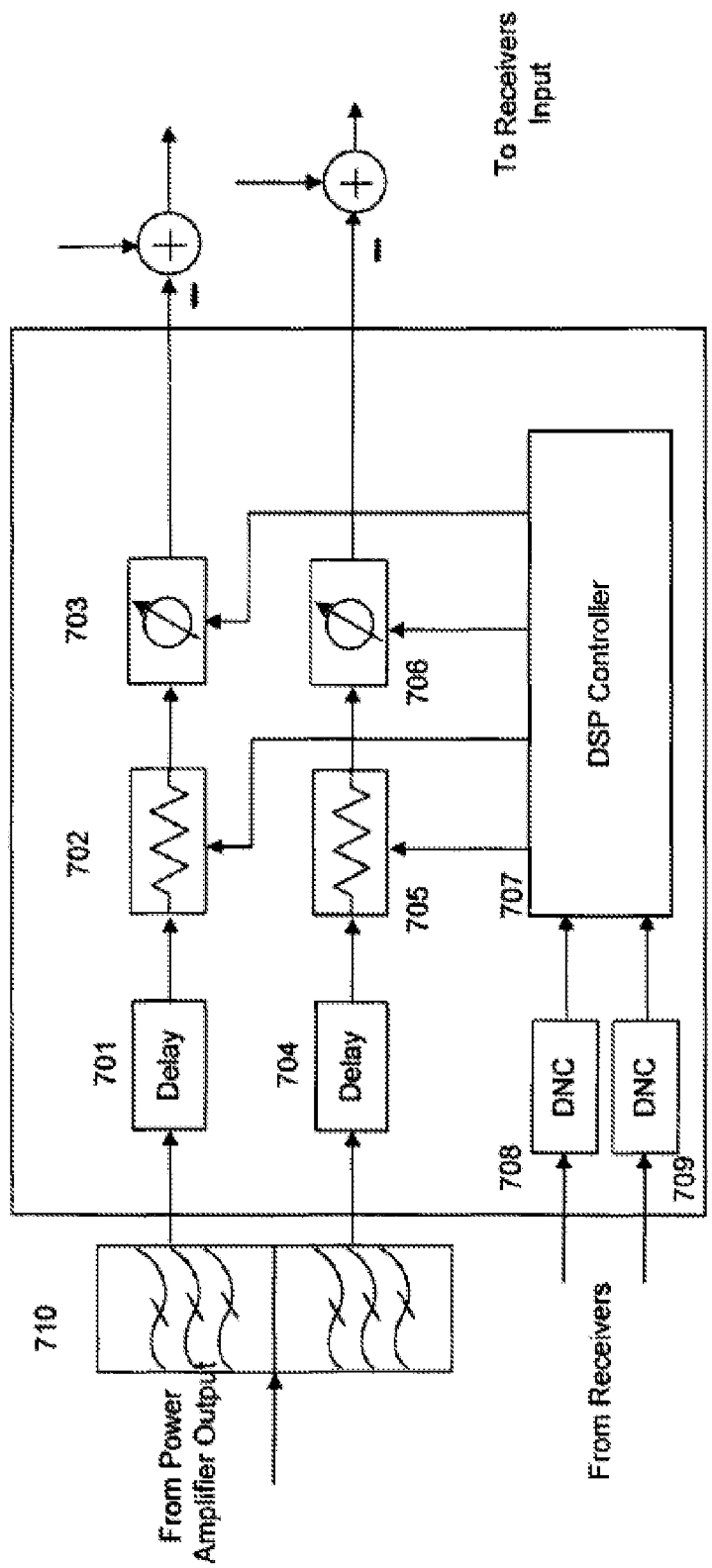
FIG. 4 is an Interference Cancellation System using Power Detection.
Figure 6:
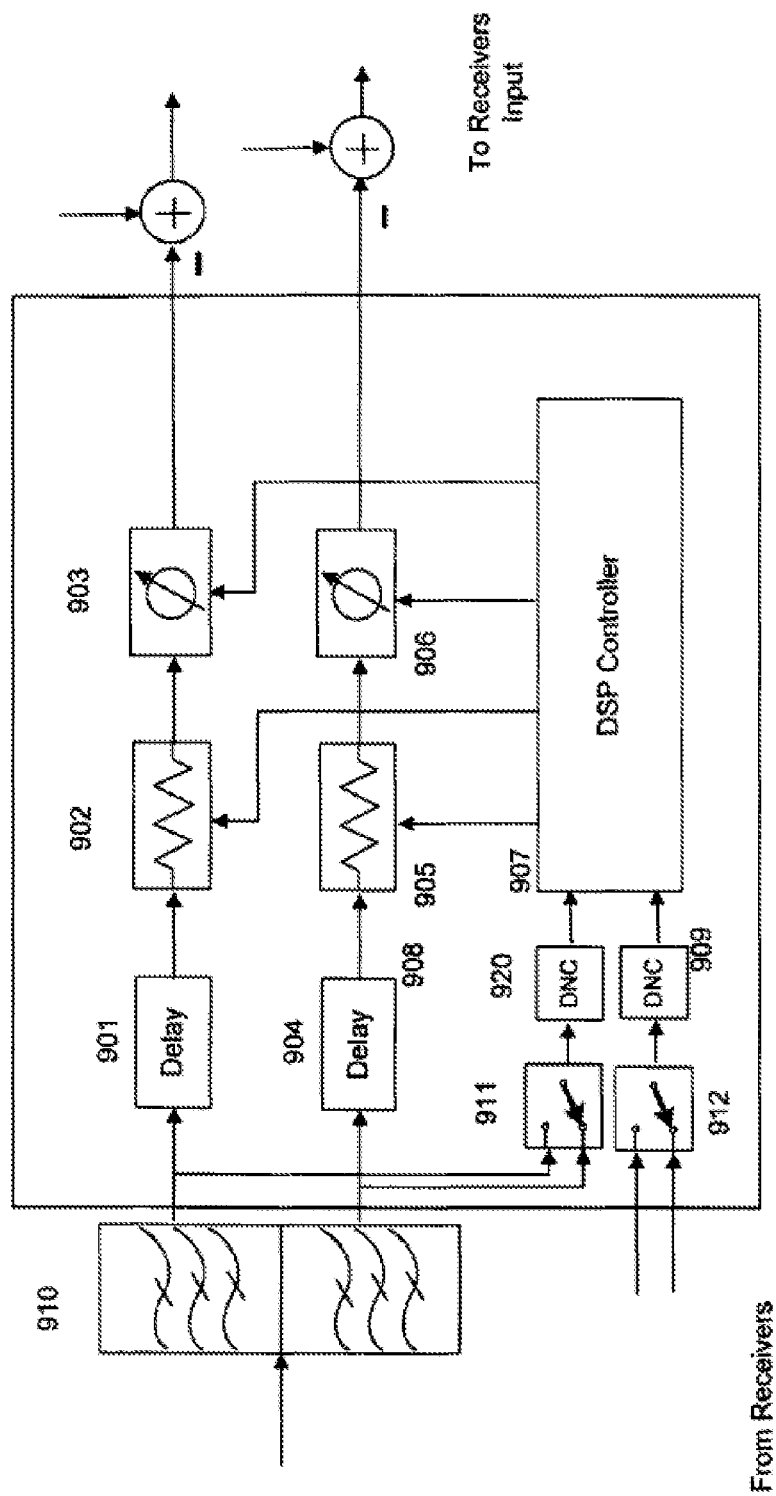
FIG. 6 is an Interference Cancellation System using Correlation.

FIG. 2 illustrates a further alternative embodiment of the dual-band single wideband power amplifier RRU analog section. Although the embodiment in FIG. 2 shows a dual-band implementation, the invention can also be utilized in single band embodiments. In the embodiment of FIG. 2, an interference cancellation system (ICS) 520 is utilized to improve the isolation between the transmitter and receivers. The interference cancellation system 520 generates a replica of the unwanted feedback signal but in anti-phase so as to eliminate the interference. The interference cancellation system 520 comprises five primary blocks: Delay, variable attenuator, variable phase shifter, Down Converter (DNC) and DSP controller, alternative arrangements of which are shown in FIGS. 4 and 6, discussed hereinafter. The ICS 520 of FIG. 2 receives incoming signals through links 506 and 507. The anti-phase output of the ICS 520 is combined with the signals from switches Rx1 and Rx2, indicated at 510 and 511, respectively, by the use of adders 551 and 552, and the resulting signal provides the inputs to the LNA's 515 and 516. The ICS 520 is an adaptive control system which continuously adjusts the variable attenuator as well as the variable phase shifter so as to maintain good interference cancellation. Alternatively, an embodiment of the ICS can comprise a fixed attenuator and phase shifter setting, eliminating the need for DSP control, although in at least some cases this results in inferior performance compared to the adaptive ICS system of FIG. 2. The remaining elements of FIG. 2 correspond to those shown in FIG. 1, and are indicated by the same numerals except that the most significant digit has been changed from "4" to "5".

Figure 3:
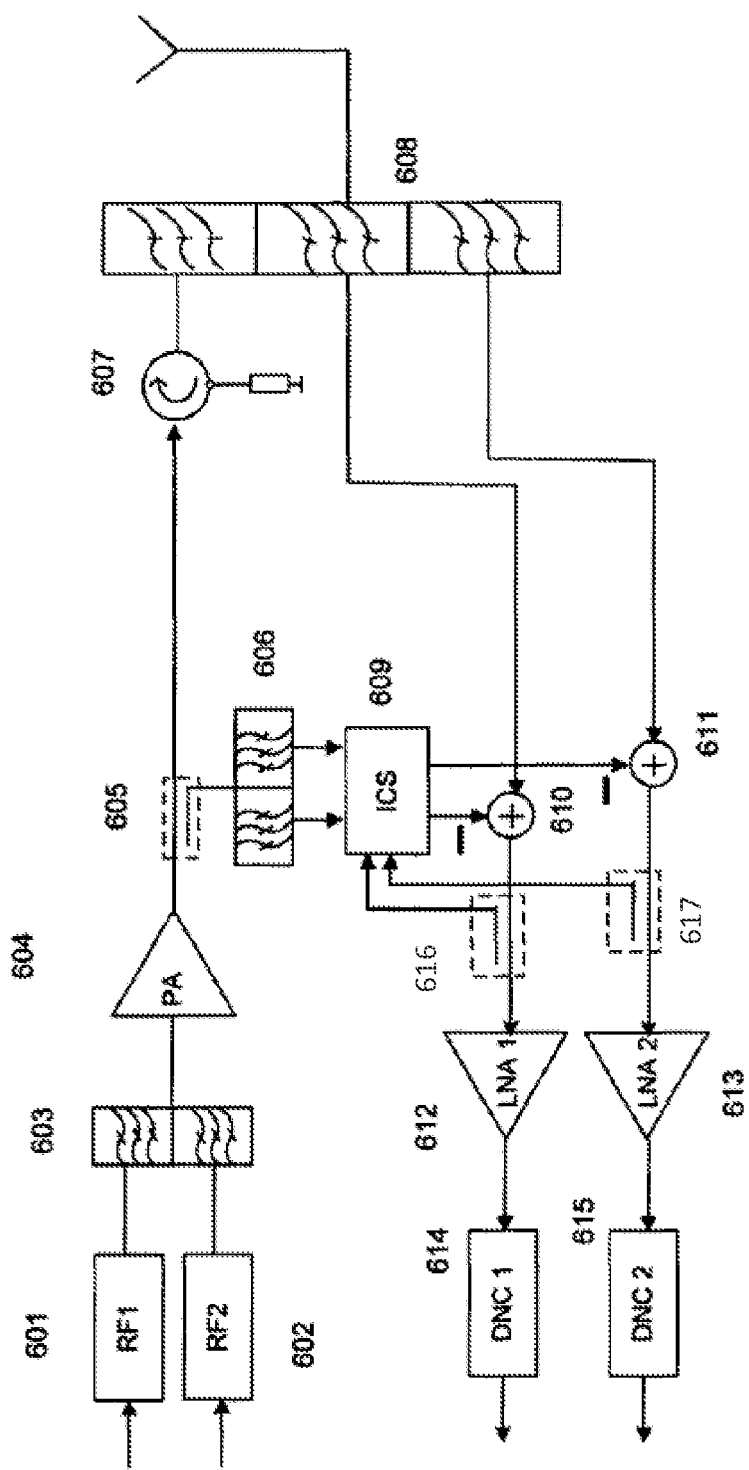
FIG. 3 is a FDD Modulation Agnostic Dual-Band Remote Radio Head with an Interference Cancellation System.

FIG. 3 shows another embodiment of the analog section of a dual-band single wideband power amplifier RRU in Frequency Division Duplex (FDD) mode. This embodiment is modulation agnostic for FDD standard systems, and elements 601-604 operate analogously to elements 401-404 of FIG. 1. In FIG. 3, the triplexer 608 separates the transmitter bands from the receiver bands. FDD systems use different transmit and receive frequencies for each channel. The function of the triplexer 608 is to pass the output of power amplifier 604 to the antenna while isolating the receivers from the transmitter output. The ICS 609 system is utilized for increasing the isolation between the transmitter output and the receiver inputs as with FIG. 2, and in FIG. 3 receives the output of PA 604 through link 605. The output of the ICS 609 is combined with the appropriate triplexer outputs through adders 610 and 611, and the links 616, 617 feeding the LNA's 612 and 613.

FIG. 4 is a depiction of one embodiment of an Interference Cancellation System (ICS). The function of the ICS is to generate a replicate of the interfering signal and place it in anti-phase to the interference, thereby eliminating the interfering signal. The input to the ICS system is a sample of the power amplifier output. Coupler 605 as illustrated in FIG. 3 is used to sample the power amplifier output. In FIG. 4, the power amplifier's output is sampled and sent to a diplexer 710. This separates the two frequencies into distinct sections. The delay block 701 time-aligns the feedback interfering signal with the sampled power amplifier output. The variable attenuator 702 is adjusted to insure that the interfering signal and the sampled signal have equal magnitude. The variable phase shifter 703 is adjusted to insure that the interfering signal and the sampled signal are in anti-phase. A Digital Signal Processor (DSP) 707 or Microprocessor is used to control the attenuator and phase shifter. A power detection based adaptive algorithm in the DSP continuously monitors the signal at the Down Converter (DNC) 708 output and minimizes the level of the interference based on the detected power level. The power level of the interference is measured at the receiver while that band is in the transmit mode of operation. The second band is similarly processed using elements 704, 705 and 706.

Figure 5:
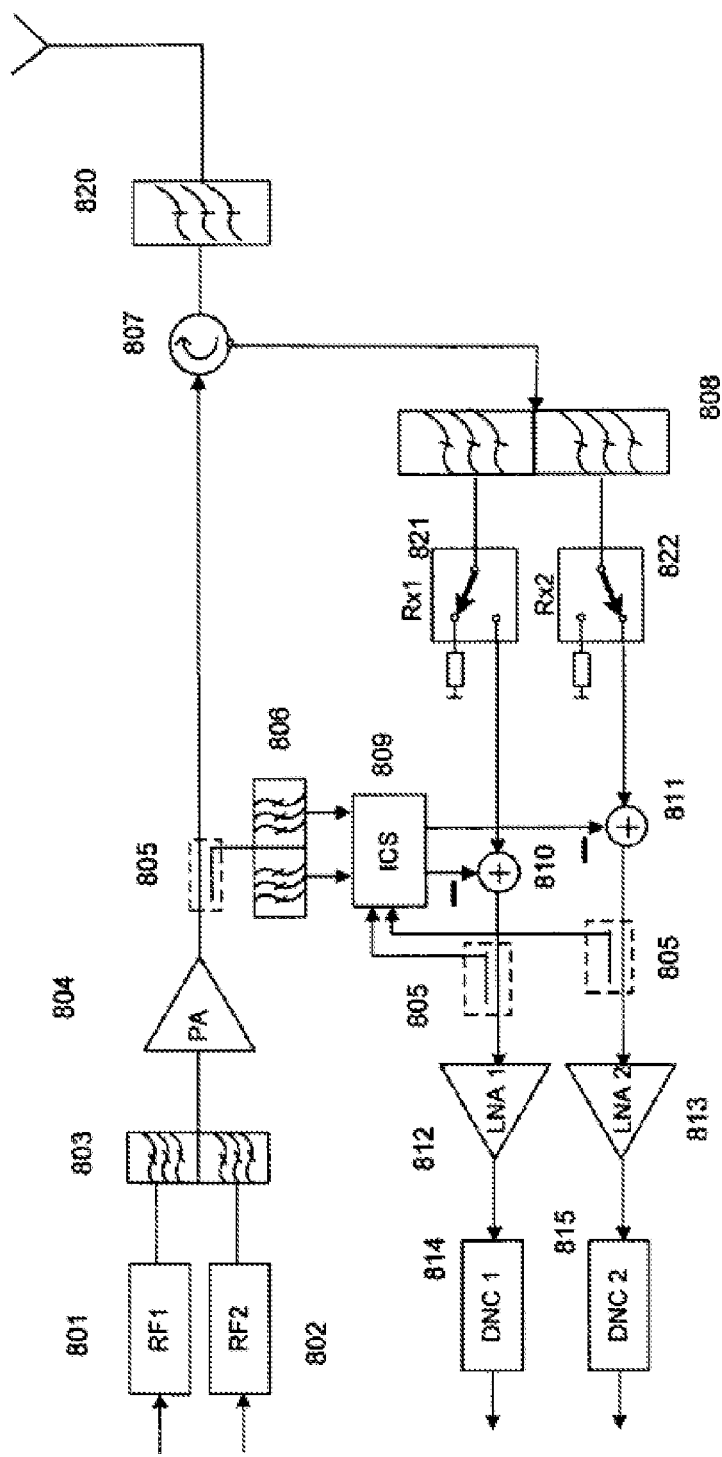
FIG. 5 is a TDD Modulation Agnostic Dual-Band Remote Radio Head with an Interference Cancellation System.

FIG. 5 shows an embodiment of the analog section of a dual-band single wideband power amplifier RRU in Time Division Duplex (TDD) mode. This embodiment is modulation agnostic for TDD standard systems. The output of wideband power amplifier 804 feeds a circulator 807. The circulator 807 provides some isolation between the transmitted signals and the receiver inputs. A multi-band filter 820 is placed between the circulator 807 and the output antenna in order to attenuate out-of-band emissions. The third port of the circulator 807 is delivered to a diplexer 808, which separates the two distinct operating bands. TDD mode requires the transmitter and receiver to operate using the same frequency band at distinct times. In order to provide isolation between the transmitter and receiver, switches 821, 822 are used. The switches 821, 822 can provide some isolation but additional isolation may be required depending on the system specifications. The ICS 809 can provide additional isolation between the transmitter output and the receiver inputs in the manner described above.

FIG. 6 is a depiction of another embodiment of an Interference Cancellation System (ICS). The function of the ICS is to generate a replicate of the interfering signal and place it in anti-phase to the interference, thereby eliminating the interfering signal. The input to the ICS system is a simple of the power amplifier output. The power amplifier's output is sampled and sent to a diplexer 910. This separates the two frequencies into distinct sections. The delay block 901 time aligns the feedback interfering signal with the sampled power amplifier output. The variable attenuator 902 is adjusted to insure that the interfering Signal and the sampled signal have equal magnitude. The variable phase shifter 903 is adjusted to insure that the interfering signal and the sampled signal are in anti-phase. A Digital Signal Processor (DSP) 907 or Microprocessor is used to control the attenuator and phase shifter. A correlation-based adaptive algorithm in the DSP is used to minimize the level of interference. The DSP correlates the two signals by controlling the output of switch 911 and the output of switch 912 after the signals have been translated to baseband using the two Downconverters 920 and 909. The switches 911 and 912 alternate between the two channels. The objective of the algorithm is to minimize the correlation between the sampled power amplifier output and the interference at the receiver. The computed correlation coefficient is used as the error function in an adaptive algorithm such as a Least Mean Squared (LMS) algorithm.

From the foregoing teachings, those skilled in the art will appreciate that the RRU system of the present invention enables the use of single wideband power amplifier for multi-band operation, which consequently saves hardware resources and reduces costs. The RRU system is also reconfigurable and field-programmable since the algorithms can be adjusted like software in the digital processor at anytime.

Moreover, the RRU system is agnostic to modulation schemes such as QPSK, QAM, OFDM, etc. in CDMA, TD-SCDMA, GSM, WCDMA, CDMA2000, and wireless LAN systems. This means that the RRU system is capable of supporting multi-modulation schemes, multi-frequency bands and multi-channels.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

We claim:

1. An interference mitigation system for improving isolation between transmitters and receivers in wireless communications systems comprising:
   a transmitter that transmits a transmit signal during a first time slot while a switch is in a first position;
   a feedback coupler that generates a feedback signal based on the transmit signal, wherein a characteristic of the feedback signal is representative of a characteristic of the transmit signal,
   an interference cancellation unit that processes the feedback signal to generate a processed signal;
   a receiver that receives an intake signal during a second time slot while the switch is in a second position, wherein the intake signal includes a first component from a signal received by the receiver and a second component from interference from the transmit signal, wherein whether the switch is in the first position or the second position is based on a time-division multiplexing technique; and
   a combiner that combines the intake signal received with the processed signal to generate a combined signal.

2. The interference mitigation system of claim 1, wherein the interference cancellation unit includes a delay block, an attenuator, and a phase shifter.

3. The interference mitigation system of claim 1, further comprising a power amplifier that amplifies the received intake signal prior to combining the intake signal with the processed signal.

4. The interference mitigation system of claim 1, further comprising switch-operating logic that controls the position of the switch.

5. The interference mitigation system of claim 1, wherein the interference cancellation unit processes the feedback signal and a second feedback signal using a correlation technique.

6. The interference mitigation system of claim 1, wherein the processing of the feedback signal includes isolating each of a plurality of frequency bands within the feedback signal.

7. The interference mitigation system of claim 1, further comprising a second switch that changes its position at times corresponding to the time-division duplexing technique.

8. The interference mitigation system of claim 1, further comprising a second feedback coupler for generating a second feedback signal based on the combined signal, wherein the second feedback signal is representative of the combined signal, wherein the interference cancellation unit further processes the second feedback signal to generate the processed signal.

9. A method for improving isolation between transmitters and receivers in wireless communications systems, the method comprising:
   transmitting a transmit signal during a first time slot while a switch is in a first position;
   generating a feedback signal based on the transmit signal, wherein a characteristic of the feedback signal is representative of a characteristic of the transmit signal;
   processing the feedback signal to generate a processed signal;
   receiving an intake signal during a second time slot while the switch is in a second position, wherein the intake signal includes a first component from a signal received by a receiver and a second component from interference from the transmit signal, wherein whether the switch is in the first position or the second position is based on a time-division multiplexing technique; and
   combining the intake signal and the processed signal to generate a combined signal.

10. The method of claim 9, wherein the processing includes one or more of introducing a delay, attenuation, and phase shift to the feedback signal.

11. The method of claim 9, wherein the processing includes shifting a phase of the feedback signal.

12. The method of claim 9, wherein the processing includes adjusting a magnitude of the feedback signal based on a magnitude of another signal.

13. The method of claim 9, wherein the transmit signal and the intake signal include modulations within a same frequency band.

14. The method of claim 9, wherein the feedback signal and a second signal are processed using a correlation technique.

15. The method of claim 9, further comprising causing a position of a second switch to change at times corresponding to the time-division duplexing technique.

16. The method of claim 9, wherein the processing of the feedback signal includes isolating each of a plurality of frequency bands within the feedback signal.

17. The method of claim 9, further comprising generating a second feedback signal based on the combined signal, wherein the second feedback signal is representative of the combined signal, and wherein the feedback signal is processed with the second feedback signal to generate the processed signal.

* * * * *